(12) United States Patent
Ramones et al.

(10) Patent No.: US 9,560,792 B2
(45) Date of Patent: Jan. 31, 2017

(54) APPARATUS AND METHOD FOR HEAT SINK ASSEMBLY

(71) Applicant: NETGEAR, Inc., San Jose, CA (US)

(72) Inventors: John Ramones, San Ramon, CA (US); Arun Raghupathy, Sunnyvale, CA (US)

(73) Assignee: Netgear, Inc., San Jose, CA (US)

( * ) Notice: Subject to any disclaimer, the term of this patent is extended or adjusted under 35 U.S.C. 154(b) by 37 days.

(21) Appl. No.: 14/609,721

(22) Filed: Jan. 30, 2015

(65) Prior Publication Data

US 2016/0227667 A1    Aug. 4, 2016

(51) Int. Cl.
   *F28F 13/00*    (2006.01)
   *H05K 7/20*    (2006.01)
   *H01L 23/40*    (2006.01)

(52) U.S. Cl.
   CPC ............. *H05K 7/2049* (2013.01); *F28F 13/00* (2013.01); *H05K 7/20409* (2013.01); *F28F 2013/005* (2013.01); *H01L 23/4093* (2013.01)

(58) Field of Classification Search
   CPC  H05K 7/2039; H05K 7/2049; H05K 7/20154; H05K 7/20163; H05K 7/20409; H05K 7/20418; H05K 7/20854; H05K 7/209; H05K 7/20963; H05K 7/20436; H05K 7/20445; H05K 7/20509; H05K 2201/10393; H05K 2201/066; H05K 1/0203; H01L 21/4882; H01L 23/36; H01L 23/3677; H01L 23/40; H01L 23/4093; H01L 23/3672; H01L 23/34; H01L 2023/4018; H01L 2023/4037; H01L 2023/4043; H01L 2023/405; H01L 2023/4068; H01L 2023/4075; H01L 2023/4081; H01L 2023/4087; H01C 1/084; F28F 13/00; F28F 2013/005; F21V 29/2212; F28D 2021/0028; F28D 2021/0029; F28D 1/06; F16B 5/06; F16B 5/0642; F16B 19/1081; B60R 13/105; B60R 13/0206
   USPC ....... 361/709–710, 718–719; 165/80.2–80.3; 257/718–719; 24/458–459, 453; 411/41, 45

See application file for complete search history.

(56) References Cited

U.S. PATENT DOCUMENTS

| | | |
|---|---|---|
| 4,890,196 A | 12/1989 | Hinshaw |
| 5,724,228 A * | 3/1998 | Lee ...................... H01L 23/467 165/122 |
| 5,870,286 A | 2/1999 | Butterbaugh et al. |
| 5,883,782 A | 3/1999 | Thurston et al. |
| 5,986,888 A | 11/1999 | Amarco et al. |

(Continued)

OTHER PUBLICATIONS

Bolt Products Inc., Flat Type Speed Nuts, Oct. 12, 2003, pp. 1-2.*

Primary Examiner — Zachary M Pape
Assistant Examiner — Amir Jalali
(74) Attorney, Agent, or Firm — Boyle Fredrickson, S.C.

(57) ABSTRACT

A heat sink assembly uses a pin and a spring arrangement to bias a heat sink against an underlying support with an electrical component in between. A lock cap, mounted on a head of the pin, selectively engages a retainer formed beneath an upper end of a heat dissipating element or fin of the heat sink to precompress the spring. When the lock cap is engaged and the spring is precompressed, the pin may be attached to the underlying support without opposing the force of the spring. When the attachment is complete and the lock cap is disengaged, the spring is allowed to act against the head of the pin and the base of the heat sink to operatively bias the heat sink against the underlying support.

20 Claims, 5 Drawing Sheets

(56) References Cited

U.S. PATENT DOCUMENTS

| | | | |
|---|---|---|---|
| 6,061,240 A | 5/2000 | Butterbaugh et al. | |
| 6,105,215 A * | 8/2000 | Lee | H01L 23/4093 165/80.3 |
| 6,317,328 B1 | 11/2001 | Su | |
| 6,392,889 B1 | 5/2002 | Lee et al. | |
| 6,404,632 B1 * | 6/2002 | Forkas | H01L 23/4006 165/185 |
| 6,859,367 B2 | 2/2005 | Davison | |
| 6,865,083 B2 * | 3/2005 | Liu | H01L 23/4093 165/80.2 |
| 6,968,889 B2 * | 11/2005 | Wang | H01L 23/4006 165/185 |
| 7,144,762 B2 * | 12/2006 | So | H01L 23/4006 257/E23.084 |
| 7,158,381 B2 * | 1/2007 | MacGregor | H01L 23/40 257/E23.083 |
| 7,177,156 B2 * | 2/2007 | Yatskov | G06F 1/20 257/E23.083 |
| 7,262,969 B2 | 8/2007 | Lee et al. | |
| 7,462,934 B2 * | 12/2008 | Reents | H01L 23/4006 257/707 |
| 7,474,532 B1 * | 1/2009 | Desrosiers | H01L 23/4006 165/185 |
| 7,495,922 B2 * | 2/2009 | Ploeg | H01L 23/40 257/718 |
| 7,639,502 B2 * | 12/2009 | Hu | H01L 23/4006 361/704 |
| 7,983,047 B2 | 7/2011 | Wu | |
| 8,120,920 B2 | 2/2012 | Fan et al. | |
| 8,422,233 B2 | 4/2013 | Li et al. | |
| 8,734,169 B2 | 5/2014 | Werner et al. | |
| 2003/0015343 A1 * | 1/2003 | Chen | H01L 23/4093 174/252 |
| 2005/0072558 A1 | 4/2005 | Whitney et al. | |
| 2005/0111196 A1 * | 5/2005 | Wang | H01L 23/4093 361/719 |
| 2005/0207123 A1 * | 9/2005 | Atkinson | H01L 23/4006 361/709 |
| 2008/0301943 A1 * | 12/2008 | Liu | B23K 1/0012 29/890.032 |
| 2009/0244849 A1 * | 10/2009 | Min | H01L 23/4093 361/710 |
| 2010/0128440 A1 * | 5/2010 | Li | H01L 23/4093 361/709 |
| 2010/0314073 A1 * | 12/2010 | Zhao | H01L 23/4093 165/80.3 |

* cited by examiner

APPARATUS AND METHOD FOR HEAT SINK ASSEMBLY

BACKGROUND OF THE INVENTION

1. Field of the Invention

The present invention relates to cooling for electrical components, and more particularly, to apparatuses and methods for providing thermal dissipation for electrical components using heat sink assemblies.

2. Discussion of the Related Art

Many electrical products today include discrete electrical components, such as semiconductor integrated circuits, which generate substantial amounts of thermal energy during normal operation. However, if the thermal energy is too great without adequate cooling, damage to the electrical component or product may result. In order to prevent such damage, a solution for thermal dissipation or cooling for the electrical component is typically necessary.

Known solutions for thermal dissipation typically include positioning a heat skink over the electrical component that generates the heat. Heat sinks generally are manufactured from a material having a high thermal conductivity and typically include a base with a series of heat dissipating elements or fins extending vertically upwardly from the base to maximize surface area. Air flow through the heat dissipating elements, with or without the assistance of a mechanical fan, operates to dissipate the thermal energy from the heat sink, and, in turn, from the electrical component.

To maximize thermal dissipation, it is often desirable to maximize the thermal contact between the heat sink and the electrical component. A variety of techniques may be used for maximizing such thermal contact, including applying an adhesive thermally-conductive layer between the heat sink and the electrical component, and/or using push pins, springs, clips and/or anchors to increase the force holding the heat sink to the associated electrical component.

However, implementing these techniques often require one or more limitations or tradeoffs. For example, a thermal adhesive layer alone may be insufficient to dissipate a desired amount of heat, and applying other elements may require consuming too much space in the electrical product. It is also difficult to hold the pins in the desired position producing tight contact of the heat sink against the electrical components while soldering the pins to the support because the springs force the pins and heat sink away from the support. As a result, pins often are soldered to the support in a position in which they are forced upwardly from their desired position and the downward pressing forces imposed by the springs are lower than desired or even non-existent. Thermal dissipation is substantially degraded as a result. Consequently, there is a need for an improved thermal dissipation solution that maximizes the amount of heat which may be dissipated while minimizing the amount of space required.

SUMMARY OF THE INVENTION

Aspects of the present invention provide a heat sink assembly using a pin and a spring arrangement to bias a heat sink against an underlying support with an electrical component in between. A lock cap, mounted on a head of the pin, retains the pin and spring in a lowered position with the spring pre-compressed. The lock cap selectively engages a retainer formed beneath an upper end of a heat dissipating element or fin of the heat sink. When the lock cap is engaged and the spring pre-compressed, the pin may be attached to the underlying support without opposing the force of the spring. When the attachment is complete, the lock cap can be disengaged, allowing the spring is allowed to act against the pin and the base of the heat sink to bias the heat sink against the underlying support with optimal force.

The retainer may be formed by a groove, ledge, or other horizontally extending structure in or on the heat dissipating element, and a retaining surface of the lock cap may selectively engage the structure by rotating into and out of engagement with the structure.

Specifically, one aspect of the present invention may include a heat sink assembly comprising a retaining pin assembly and a heat sink including a base and a plurality of heat dissipating elements extending at least generally vertically upwardly from the base. A retainer is associated with one the heat dissipating elements for selective engagement with the retaining pin assembly. The retainer is horizontally offset relative to an overlying portion of the at least one heat dissipating element. The retainer is configured to be selectively engaged by rotation of the head of a retaining pin assembly. Also, the base includes an opening that allows a portion of the retaining pin assembly to pass there through for connection to an underlying support.

The retaining pin assembly may include a pin having a head and, a body that passes through the opening of the heat sink. The retaining pin assembly may additionally include a spring that is disposed around the body of the pin and over the base of the heat sink. The spring is pre-compressed between the base and the head of the pin when the pin assembly engages the retainer on the heat dissipating element.

It is thus a feature of at least one embodiment of the invention to provide a mechanism in a heat sink suited to hold a spring in a greater compression state while a headed pin passing through the heat is attached to a board or other underlying support, such as by soldering. Then, after attachment, the spring may be released to a lesser compression state act between the head of the pin and the heat sink to increase the force biasing the heat sink against an electrical component located between the heat sink and the support.

A lock cap may be mounted on the head of the pin. The cap may have an at least generally horizontal-extending retaining surface extending in first and second directions, with the retaining surface being longer in the first direction than in the second direction. Rotation of the cap about a vertical axis thus moves the retaining surface into and out of engagement with a mating surface on or in the heat sink. The cap may be removable. It also may be sized to fit between the fins of the heat sink when oriented in a first manner, then rotated to engage the retainer of either fin when oriented in a second manner. Additionally, the cap may be integrated into the pin and not be removable.

Another aspect of the present invention may include a method of assembling a heat sink assembly. The method may comprise: (a) inserting a pin assembly having a head and a body between first and second heat dissipating elements and through a spring and an opening in the base the heat sink; (b) forcing the pin assembly downwardly to compress the spring; (c) while the spring is compressed, engaging a retainer on the heat dissipating element with a retaining surface of the pin assembly to hold the spring in its compressed state; (d) while the retaining surface on the pin assembly is engaged with the retainer on the heat dissipating element, attaching the pin to a PCB or other support structure disposed below the base of the heat dissipating element, such as by solder or the like; and then (e) disengaging the retaining surface on the pin assembly from the retainer on the heat dissipating element.

These and other features and advantages of the invention will become apparent to those skilled in the art from the following detailed description and the accompanying drawings. It should be understood, however, that the detailed description and specific examples, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Preferred exemplary embodiments of the invention are illustrated in the accompanying drawings in which like reference numerals represent like parts throughout, and in which.

DETAILED DESCRIPTION OF THE PREFERRED EMBODIMENTS

Figure 1:
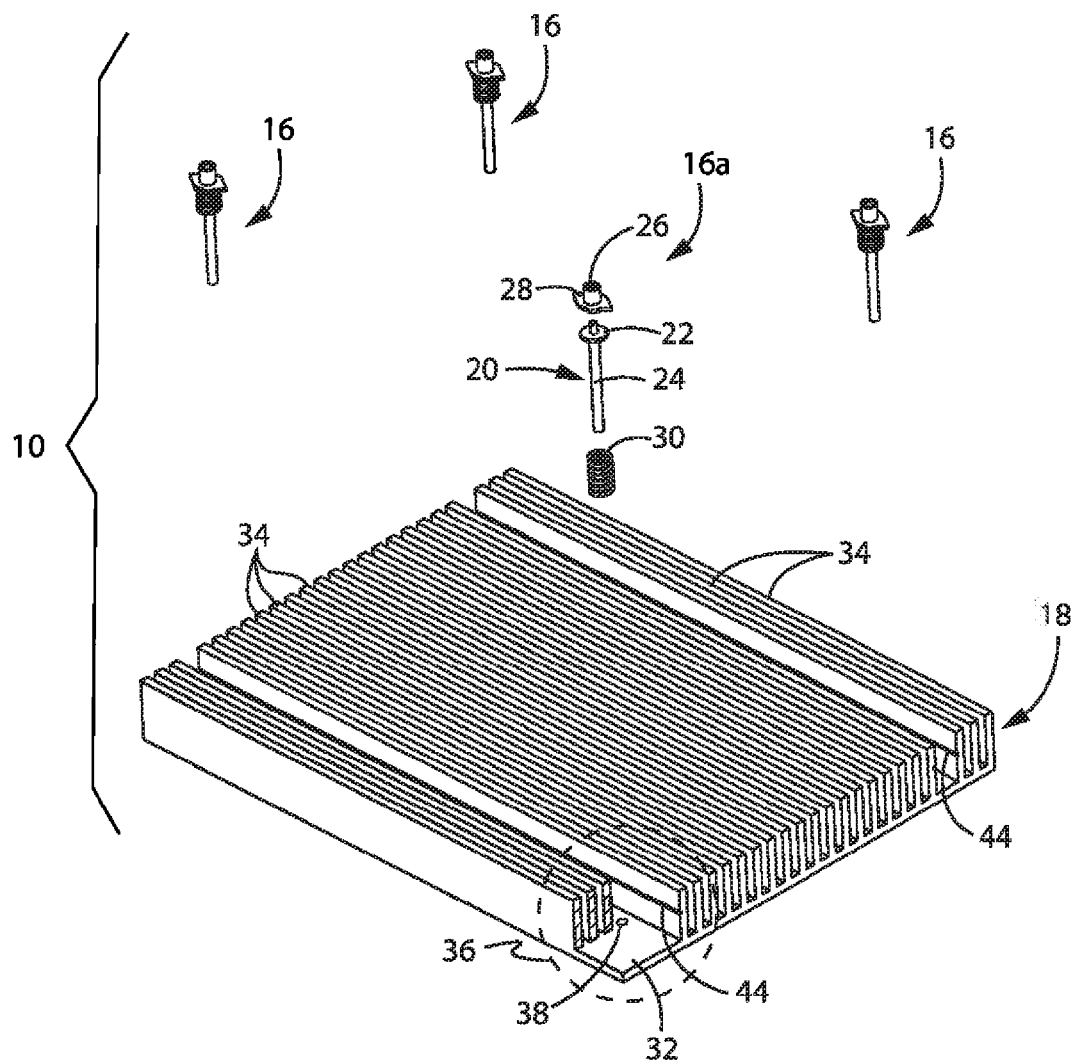
FIG. 1 is a partially cut-away exploded perspective view of a heat sink assembly, shown in an exemplar system with an electrical component that is mounted to an underlying support, in accordance with an embodiment of the invention.

Referring now to FIG. 1, an exploded perspective view of a heat sink assembly 10, shown in an exemplar system with an electrical component 12 that is mounted to an underlying support 14, is provided in accordance with an embodiment of the invention. The heat sink assembly 10 includes one or more retaining pin assemblies 16, and a heat sink 18. The heat sink assembly 10 is positioned over the electrical component 12, which is a heat generating component such as a packaged semiconductor integrated circuit or other element. The electrical component 12 is mounted to the underlying support 14, which may be a Printed Circuit Board (PCB) or similar substrate, such as by wave soldering. A thermal adhesive layer or thermal pad (not shown) may also be provided between the heat sink assembly 10 and the electrical component 12.

Figure 4A:
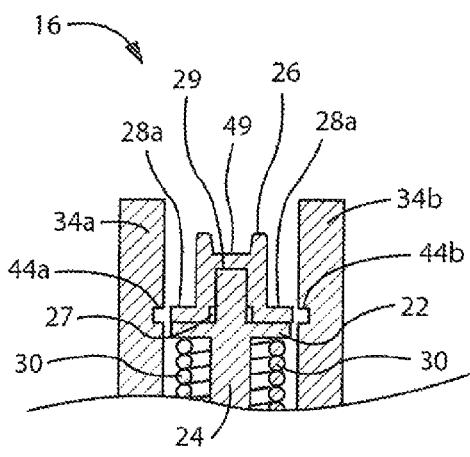
FIG. 4A is a detailed sectional side elevation view of a lock cap mounted on the head of the pin of FIGS. 1-3 and positioned in proximity to retainers of the heat dissipating element, before engagement of the retainers.
Figure 4B:
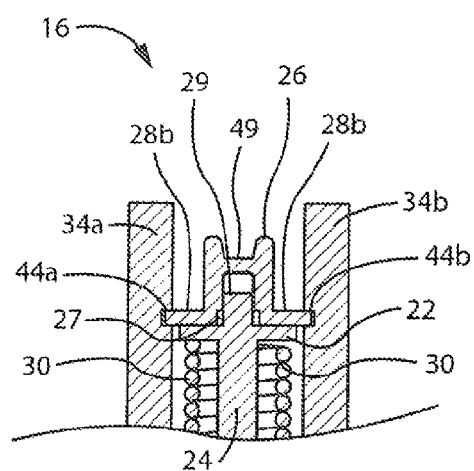
FIG. 4B is a detailed sectional side elevation view of a lock cap mounted on the head of the pin of FIGS. 1-3 and engaging the retainers.
Figure 5:
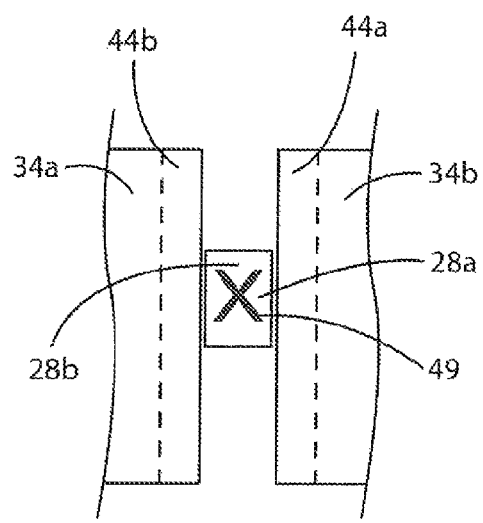
FIG. 5 is a plan view of a rectangular lock cap positioned in proximity to retainers of heat dissipating elements in accordance with an embodiment of the invention.
Figure 6:
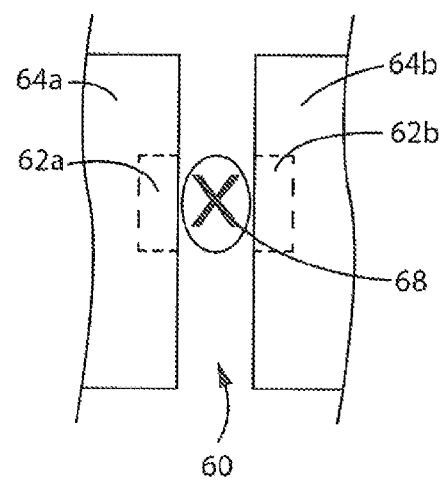
FIG. 6 is a plan view of a rounded or ovoid lock cap positioned in proximity to alternative retainers of heat dissipating elements in accordance with an embodiment of the invention.

Still referring to FIG. 1, each retaining pin assembly 16 may comprise a pin 20 or other longitudinal structure having a head 22 and a body 24. A lock cap 26 may be mounted on the head 22 of the pin 20 such that the lock cap 26 is rotatable or otherwise movable relative to the pin 20. The lock cap 26 may be mounted simply by resting the lock cap 26 on the head 22. Specifically, as best seen in FIGS. 4A and 4B, the lock cap 26 may have a recess 27 that extends vertically upwardly from the bottom surface of the lock cap 26 so as to be insertable over a post 29 that protrudes upwardly beyond the head of the pin. In its operative position or engagement shown in FIG. 4B in which the lock cap 26 engages retaining elements 44a and 44b on the heat dissipating elements as detailed below, the lock cap 26 is clamped between the retaining elements 44a and 44b and the head 22 of the pin. The lock cap 26 can be rotated from its disengaged position of FIG. 4A to its engaged position of FIG. 4B by engaging a groove 49 in the top of the lock cap 26, best seen in FIGS. 5 and 6, using a screwdriver or the like. It should be noted that that the lock cap 26 alternatively could be retained on the pin 20 using a snap a ring or other secure arrangement. In addition, the lock cap 26 may provide an at least generally horizontal-extending retaining surface 28, which may be a flange or rib, extending in first and second direction, and the retaining surface 28 may be longer in the first direction than in the second direction. Also, the body 24 of the pin 20 may pass through a biasing mechanism such as coil spring 30 which is capable of resiliently biasing the heat sink 18 against the component 12 in order to enhance thermal contact therebetween.

The heat sink 18 may comprise a base 32 and a plurality of heat dissipating elements 34, which may be fins, extending at least generally vertically upwardly from the base 32. The heat sink 18 may be manufactured from metal or another material having a high thermal conductivity and may be designed such that air flowing through the heat dissipating elements 34 dissipates thermal energy from the heat sink 18, and, in turn, from the electrical component 12. As shown in a cutaway area 36, the base 32 may also include one or more openings 38 (four such openings 38 are provided in the vicinities of the corners of the rectangular heat sink 18 in the illustrated embodiment). The heat dissipating elements 34 may be spaced further apart in regions flanking the openings 38 the heat sink openings 38 and the pin assemblies 16. Each opening 38 is configured to allow a portion of the body 24 of a corresponding pin assembly 16 to pass therethrough for connecting to the underlying support 14. Consequently, the underlying support 14 may also include one or more support openings 40, each of which substantially aligned with an opening 38 in the heat sink 18, for receiving the body 24 of the pin 20.

At least one of the heat dissipating elements 34 adjacent to each opening 38 also includes a retainer 44 located beneath an upper end of the respective heat dissipating element 34. In the illustrated embodiment, facing retainers 44 are provided on both heat dissipating elements 34 that flank each heat sink opening 38. The retainer 44 provides selective engagement with the retaining pin assembly 16. The retainer 44 is horizontally offset relative to an overlying portion of the respective heat dissipating element 34, and is configured to be selectively engaged by the retaining pin assembly 16, such as by the lock cap 26. The retainer 44 may be a groove formed in the heat dissipating elements 34, which can be easily formed during fabrication of the heat sink 18. Alternatively, other retaining configurations may be similarly provided, such as a ledge or shoulder extending outwardly from the heat dissipating elements 34.

In operation, the lock cap 26 may selectively engage with retainer elements 44a or 44b provided by one or more of the heat dissipating elements 34. When the lock cap 26 is engaged, the coil spring 30 is pre-compressed between the head 22 of the pin 20 and the base 32 of the heat sink 18. Next, the body 24 of the pin assembly 16, which in this position passes through the heat sink opening 38, and is aligned with the support opening 40, may be connected to the support opening 40, such as via wave soldering, without having to oppose the biasing force that otherwise would be imposed by the coil spring 30. Finally, the lock cap 26 may be disengaged, such that the coil spring 30 is released and permitted to compress between the head 22 of the connected pin 20 and the base 32 of the heat sink 18. As a result, the coil spring 30 operates to force the heat sink 18 onto the electrical component 12 using a minimal amount of space.

Figure 2:
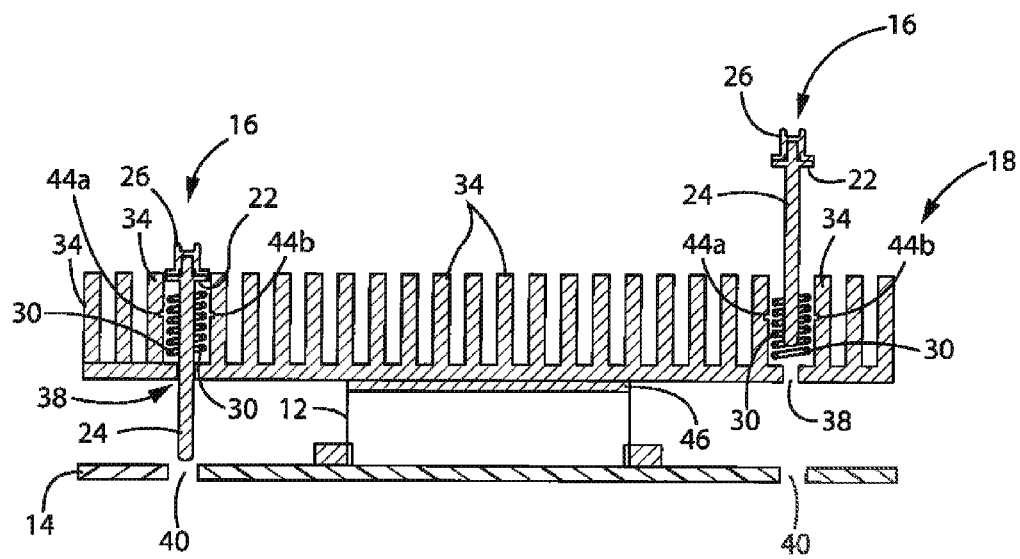
FIG. 2 is a sectional side elevation view of the heat sink assembly of FIG. 1 before engagement of a retaining pin assembly to a retainer, and before attachment of a pin of the retaining pin assembly to an underlying support.

Referring now to FIG. 2, a side view of the heat sink assembly 10, in communication with the electrical component 12 that is mounted to the underlying support 14, before engagement of the retaining pin assembly 16 to the retainer 44, and before attachment of the pin 20 to the underlying support 14, is provided. The lock cap 26 may be mounted to the head 22 of the pin 20. The body 24 of the pin 20 may pass through the coil spring 30 through the heat sink opening 38 in preparation for connection to the support opening 40. A thermal adhesive layer or thermal pad 46 may be provided between the heat sink assembly 10 and the electrical component 12 for maximizing heat transfer between the electrical component 12 and the heat sink 18.

Figure 3:
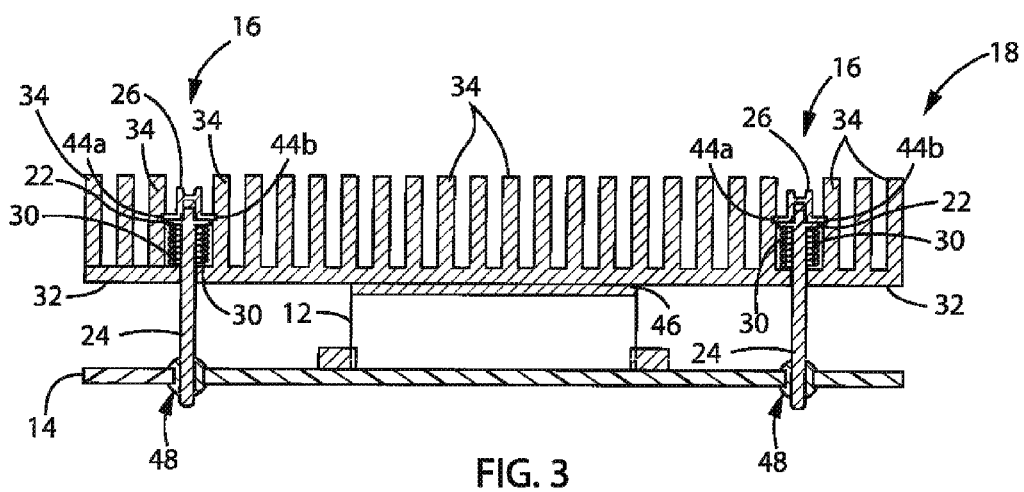
FIG. 3 is a sectional side elevation view of the heat sink assembly of FIGS. 1 and 2 during engagement of the retaining pin assembly to the retainer, and during attachment of the pin of the retaining pin assembly to the underlying support.

Referring now to FIG. 3, a side view of the heat sink assembly 10 is shown following attachment of the heat sink assembly 10 to the underlying support 14 and while the lock caps 26 are still engaged with the retainers elements 44a and 44b. The coil spring 30 is pre-compressed between the base 32 of the heat sink 18 and the head 22 of the pin 20 due to engagement of the lock caps 26 with the associated retainers elements 44a and 44b. Due to this precompression, spring forces are no longer available to bias the pin assemblies 16 out of the heat sink openings 38. As a result, the body 24 of each pin can be attached to the underlying support with while being located at a position in which the spring can provide a good biasing effect, but without having to overcome opposition from the spring forces during the attachment process. In a preferred embodiment, the connection 48 could be made by solder, though other forms of connection/attachment could be provided within the scope of the invention.

Referring again to FIGS. 4A and 5, detailed side and plan view of the lock cap 26 of a pin assembly 16, mounted on the head 22 of the pin 20, and positioned in proximity to retainers elements 44a and 44b of respective heat dissipating elements 34a and 34b. The retainer elements 44a and 44h are shown disengaged from the retaining surface 28 of the lock cap 26, which could correspond to a period of time before or after forming the connection 48 between the body 24 of the pin 20 and the support opening 40 as described above with respect to FIG. 3. The lock cap 26 may be substantially rectangular in shape so that the retaining surface 28 of the lock cap 26 is shorter in a second direction 28a than in a first direction 28b. With the retaining surface 28 shorter in the second direction 28a than the separation distance between the adjacent heat dissipating elements 34a and 34b, the lock cap 26 can be placed into position between the adjacent heat dissipating elements 34a and 34b. As a result the retaining surface 28 is fully disengaged from the retainers elements 44a and 44h when the lock cap 26 is in the position shown in FIGS. 4A and 5. Moreover, in this configuration, the retaining surface 28 fits between the space provided by the adjacent heat dissipating elements 34a and 34b. With the retaining surface 28 longer in the first direction 28b than a separation distance between the adjacent heat dissipating elements 34a and 34b, the lock cap 26 can engage the retainer elements 44a and 44b.

Referring now to FIG. 4B, a detailed side view of the retainers elements 44a and 44b shown fully engaged with the retaining surface 28 of the lock cap 26 of a pin assembly 16 is provided, which could correspond to a period of time during forming of the connection 48 between the body 24 and the support opening 40 as described above with respect to Fig. The lock cap 26 may rotate clockwise or counterclockwise from a first position, as shown in FIG. 4A, to a second position, as shown in FIG. 4B, for transitioning between the disengaged and the engaged positions. As discussed above, this rotation may be accomplished, for example, by applying a screw driver or other tool to the groove 49 disposed over the lock cap 26. As the retaining surface 28 of the lock cap 26 is longer in the first direction 281) than in the second direction 28a, the retaining surface 28 is fully engaged with the retainers elements 44a and 44b, and the coil spring 30 is held pre-compressed between the lock cap 26 and the base 32 of the heat sink 18.

In alternative embodiments, other shapes for the lock cap, and/or other configurations for the retainers, may be used. For example, the lock cap may be asymmetrical with only one side longer than any other side. Also, only a single retainer may be used, which could be a groove, a ledge, or otherwise, and which could be provided in a limited area (in proximity to the aligned openings of the heat sink and the underlying support) or provided along an entire length of the respective heat dissipating element. Another possible embodiment is provided in FIG. 6, in which an ovoid lock cap 60 is positioned in proximity to retainers elements 62a and 62b of heat dissipating elements 64a and 64b, before engagement therebetween. In addition, in this embodiment, the retainers elements 62a and 62b may be limited length grooves in the heat dissipating elements 64a and 64b. Accordingly, it will be appreciated that a variety of retention techniques may be used within the spirit of the present invention.

Figure 7:
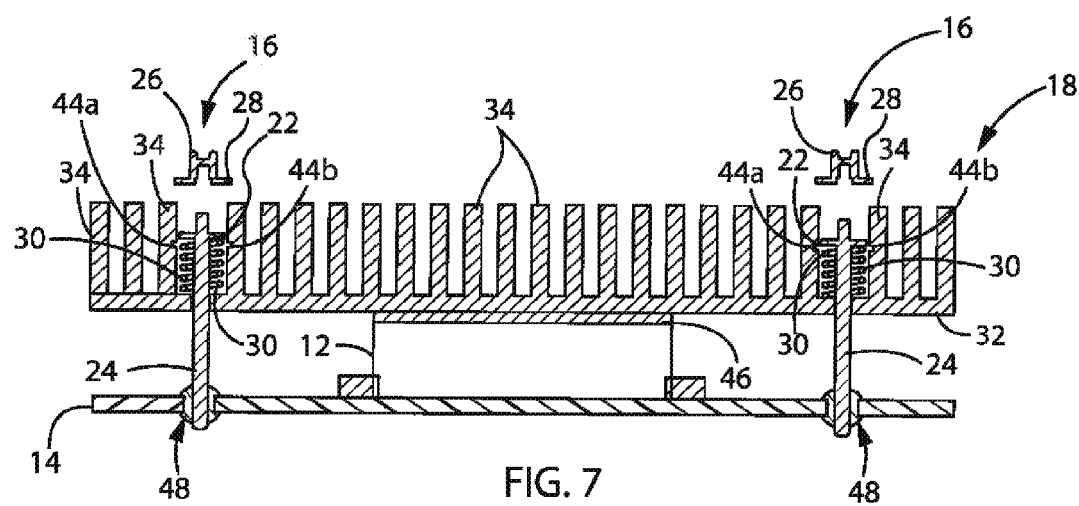
FIG. 7 is a sectional side elevation view of the heat sink assembly of FIGS. 1 1-4A in which retainers of the lock caps are disengaged from the retainers of heat dissipating elements and the spring of each pin assembly is allowed to bias the heat sink against the underlying support.

Referring now to FIG. 7, a side view of the heat sink assembly 10, as described above with respect to FIGS. 1-4, illustrates the completed assembly after removal of the lock caps 26. Here, with the connection 48 complete, the lock cap 26 of each respective pin assembly 16 is disengaged from its associated retainer elements 44a and 44b, and the coil spring 30 is allowed to act between the head 22 of the pin 20 and the base 32 of the heat sink 18 without acting on the heat dissipating elements 34. The pin 20 is also fixed in position at this time due to its connection to the underlying 14 by the soldered connection 48. Accordingly, the heat sink 18 is biased against the underlying support 14, thereby applying an optimal amount of force for transferring heat from the electrical component 12 to the heat sink 18. The lock caps 26, having been rotated to their disengaged positions, can now be removed and reused or discarded.

Figure 8:
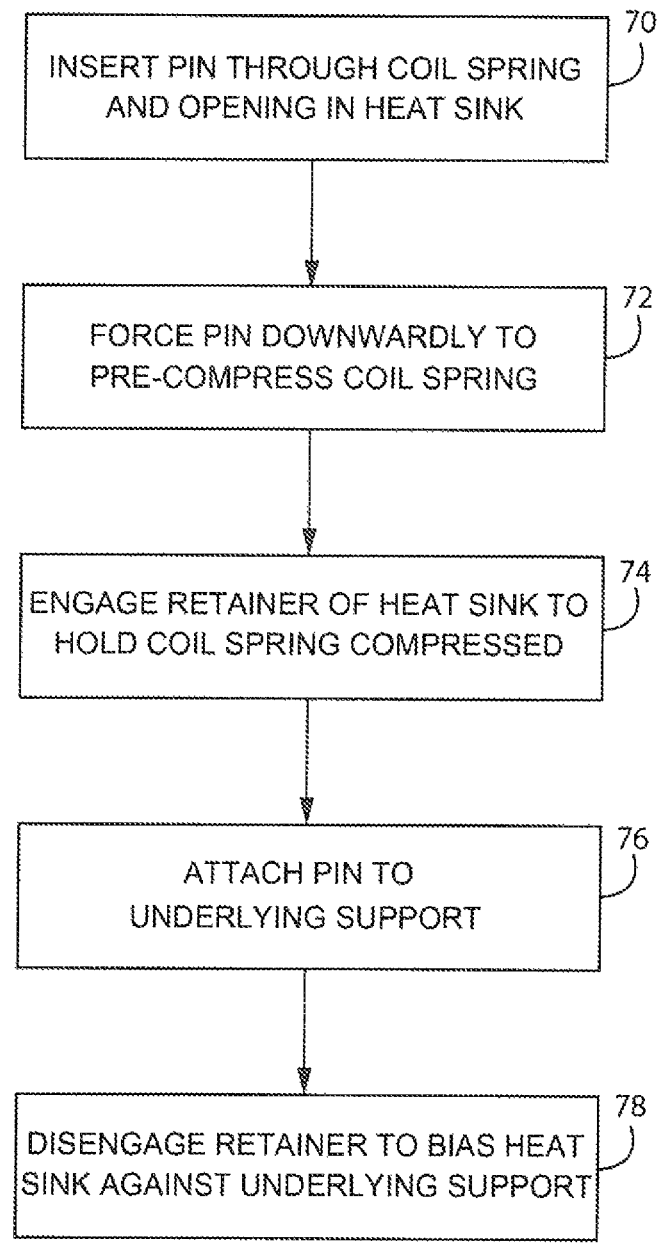
FIG. 8 is a flowchart illustrating a method of assembling a heat sink assembly in accordance with an embodiment of the invention.

Referring now to FIG. 8, an exemplar flowchart illustrating a method of assembling a heat sink assembly is provided in accordance with an embodiment of the invention. In this process block, a pin having a head and a body may be inserted through a coil spring and an opening in the base of a heat sink at blocks 70. Next, in process block 72, a pin assembly, which includes the pin and a retaining surface, may be forced downwardly to compress the coil spring between the head of the pin and the base of the heat sink. The retaining surface may be located, for example, on a lock cap located above the head of the pin as described above.

Next, in process block 74, while the coil spring is compressed, the retaining surface is moved into engagement with the mating retainer on the heat dissipating element to hold the coil spring in its compressed state. Engaging may comprise, for example, rotating a lock cap located above the head of the pin from a first position in which the retaining surface is spaced from the retainer to a second position in which the retaining surface engages the retainer. Also, the retainer may be formed on a surface of a first heat dissipating element, and may face another retainer that is formed on a second heat dissipating element. In this case, the retaining surface on the pin assembly may effectively engage both retainers.

Next, in process block 76, while the retaining surface on the pin assembly is engaged with the retainer on the heat dissipating element, the pin is attached to an underlying support disposed below the base, such as by soldering the pin to a PCB. Finally, in process block 78, the retaining surface on the pin assembly is disengaged from the retainer on the heat dissipating element such as by rotating the lock cap from the second position to the first position. As a result, the heat sink is biased against the underlying support with the electrical component in between.

Although the best mode contemplated by the inventors of carrying out the present invention is disclosed above, practice of the above invention is not limited thereto. It will be manifest that various additions, modifications and rearrangements of the features of the present invention may be made without deviating from the spirit and the scope of the underlying inventive concept.

What is claimed is:

1. A heat sink assembly comprising:
a retaining pin assembly having a pin and a lock cap; and
a heat sink including
a base; and
a plurality of heat dissipating elements extending at least generally vertically upwardly from the base;
wherein one of the heat dissipating elements includes a retainer located beneath an upper end thereof for selective engagement with the lock cap of the retaining pin assembly upon movement of the lock cap relative to the at least one heat dissipating element, the retainer being horizontally offset relative to an overlying portion of the at least one heat dissipating element and configured to be selectively engaged by the lock cap of the retaining pin assembly; and
wherein the base includes an opening configured to allow a portion of the retaining pin assembly to pass there through for connection to an underlying support.

2. The heat sink assembly of claim 1, wherein the retaining pin assembly further comprises a spring, and a wherein the pin has a head and a body, wherein the body of the pin passes through the opening of the heat sink, wherein the spring is disposed around the body of the pin and over the base of the heat sink, and wherein the spring is pre-compressed between the base and the head of the pin when the clock ap engages the retainer on the heat dissipating element.

3. The heat sink assembly of claim 2, wherein the lock cap is rotatably mounted on the head of the pin, wherein the Jock cap provides an at least generally horizontal-extending retaining surface extending in first and second directions, wherein the retaining surface is longer in the first direction than in the second direction.

4. The heat sink assembly of claim 3, wherein a length of the retaining surface in the first direction, from center to an outer edge thereof, is longer than a spacing between the center of the retaining surface and the retainer on the heat dissipating element, and wherein the length of the retaining surface in the second direction, from the center to an outer edge thereof, is shorter than the spacing between the center of the retaining surface and the retainer on the heat dissipating element.

5. The heat sink assembly of claim 4, wherein the retaining surface is substantially rectangular in shape.

6. The heat sink assembly of claim 4, wherein the retainer includes a groove formed in the heat dissipating element between upper and lower ends thereof.

7. The heat sink assembly of claim 6, wherein the pin assembly is located between first and second heat dissipating elements and the groove comprises a first groove formed in the first heat dissipating element, and a second groove formed in the second heat dissipating element for selectively being engaged by the retaining surface of the lock cap of the pin assembly when the spring is pre-compressed.

8. The heat sink assembly of claim 7, wherein the first and second heat dissipating elements are spaced further apart than another pair of adjacent heat dissipating elements.

9. The heat sink assembly of claim 3, further comprising a Printed Circuit Board (PCB) disposed below the base, wherein the pin is attached to the PCB.

10. The heat sink assembly of claim 9, wherein the pin is attached to the PCB by solder.

11. The heat sink assembly of claim 1, further comprising a thermal pad disposed below the base.

12. A system for dissipating heat from an electrical component comprising:
(a) a heat sink including:
a base; and
a plurality of heat dissipating elements extending vertically from the base,
wherein facing at least generally vertical surfaces of adjacent first and second heat dissipating elements include first and second at least generally horizontal grooves, respectively, and
wherein the base includes an opening disposed between the first and second heat dissipating elements and configured to allow a pin to pass through the heat sink;
(b) the pin having a head and a body;
(c) a spring disposed around the body of the pin and over the base of the heat sink;
(d) a cap located above the head of the pin and having an at least generally horizontally extending retaining surface that selectively engages the first and second grooves to pre-compress the spring; and
(e) a PCB disposed below the base of the heat sink;
wherein the body of the pin passes through the spring and the opening of the heat sink and the pin is soldered to the PCB; and wherein
when the retaining surface of the cap is disengaged from the grooves, a force of the spring acts against the head of the pin and the base of the heat sink to bias the heat sink against the PCB.

13. The system of claim 12, wherein the retaining surface on the cap extends in first and second directions, wherein the retaining surface is longer in the first direction than in the second direction.

14. The system of claim 13, wherein the retaining surface is longer in the first direction than a separation distance between the first and second heat dissipating elements, and wherein the retaining surface is shorter in the second direction than, the separation distance between the first and second heat dissipating elements.

15. The system of claim 14, further comprising a thermal pad disposed below the base.

16. A method of assembling a heat sink assembly, the heat sink assembly including a heat sink having a base and a plurality of heat dissipating elements extending at least generally vertically from the base, wherein a retainer is located beneath an upper end of one of the heat dissipating elements, the retainer being horizontally offset relative to an overlying portion of the at least one heat dissipating element, the method comprising:
   (a) inserting a pin between first and second heat dissipating elements and through a spring and an opening in the base of the heat sink, the sin assembly including a pin having a head and a body and further having a lock cap on the pin;
   (b) forcing the pin assembly downwardly to compress the spring;
   (c) while the spring is compressed moving the lock cap relative to the heat dissipating elements to engage the retainer on the heat dissipating element with a retaining surface on the lock cap to hold the spring in its compressed state;
   (d) while the retaining surface on the lock cap of the pin assembly is engaged with the retainer on the heat dissipating element, attaching the pin to an underlying support disposed below the base; and then
   (e) disengaging the retaining surface on the lock cap of the pin assembly from the retainer on the heat dissipating element.

17. The method of claim 16, wherein the lock cap is located above the head of the pin assembly.

18. The method of claim 17, wherein the engaging step comprises rotating the lock cap about the pin from a first position in which the retaining surface is spaced from the retainer to a second position in which the retaining surface engages the retainer.

19. The method of claim 17, wherein the underlying support is a PCB, and the attaching step comprises soldering the pin assembly to the PCB.

20. The method of claim 17, wherein the retainer is formed on a surface of the first heat dissipating element and faces the second retainer that is formed on the second heat dissipating element and that is engaged by the retaining surface on the lock cap of the pin assembly when the retaining surface engages the retainer of the first heat dissipating element.

* * * * *

UNITED STATES PATENT AND TRADEMARK OFFICE
CERTIFICATE OF CORRECTION

PATENT NO. : 9,560,792 B2  
APPLICATION NO. : 14/609721  
DATED : January 31, 2017  
INVENTOR(S) : Ramones et al.

Page 1 of 1

It is certified that error appears in the above-identified patent and that said Letters Patent is hereby corrected as shown below:

In the Claims

| | |
|---|---|
| Claim 2, Line 2<br>Column 7, Line 60 | Delete "a" between "and" and "wherein" |
| Claim 2, Line 8<br>Column 7, Line 66 | Replace "clock ap" with "lock cap" |
| Claim 3, Line 2<br>Column 8, Line 2 | Replace "Jock" with "lock" |
| Claim 14, Line 5<br>Column 9, Line 9 | Delete "," after "than" |
| Claim 16, Line 11<br>Column 9, Line 23 | Replace "sin" with "pin" |
| Claim 16, Line 14<br>Column 9, Line 26 | Add "assembly" after "pin" |
| Claim 16, Line 16<br>Column 9, Line 28 | Add "," between "compressed" and "moving" |

Signed and Sealed this  
Eighteenth Day of April, 2017

Michelle K. Lee  
*Director of the United States Patent and Trademark Office*